US 11,276,748 B2

(12) United States Patent
Li et al.

(10) Patent No.: US 11,276,748 B2
(45) Date of Patent: Mar. 15, 2022

(54) SWITCHABLE METAL INSULATOR METAL CAPACITOR

(71) Applicant: International Business Machines Corporation, Armonk, NY (US)

(72) Inventors: Baozhen Li, South Burlington, VT (US); Chih-Chao Yang, Glenmont, NY (US); Andrew Tae Kim, Orangevale, CA (US); Barry Linder, Hastings-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 16/527,830

(22) Filed: Jul. 31, 2019

(65) Prior Publication Data
US 2021/0036096 A1    Feb. 4, 2021

(51) Int. Cl.
*H01L 49/02*    (2006.01)
*H01L 45/00*    (2006.01)

(52) U.S. Cl.
CPC .............. *H01L 28/40* (2013.01); *H01L 45/06* (2013.01); *H01L 45/126* (2013.01); *H01L 45/16* (2013.01)

(58) Field of Classification Search
CPC ....... H01L 45/06; H01L 45/126; H01L 45/16; H01L 45/04; H01L 28/40
USPC ............................................................ 257/4
See application file for complete search history.

(56) References Cited

U.S. PATENT DOCUMENTS

| | | |
|---|---|---|
| 5,789,964 A | 8/1998 | Voldman |
| 6,844,771 B1 | 1/2005 | Chen |
| 6,940,117 B2 | 9/2005 | Coolbaugh |
| 7,074,707 B2 | 7/2006 | Frank |
| 8,669,828 B1 | 3/2014 | Wong |
| 9,029,187 B1 | 5/2015 | Ananthan |
| 9,343,523 B2 | 5/2016 | Phatak |
| 9,385,079 B2 | 7/2016 | Chang |
| 9,413,169 B2 | 8/2016 | Disarro |
| 9,502,886 B2 | 11/2016 | Wang |
| 9,627,312 B2 | 4/2017 | Childs |
| 9,824,825 B2 | 11/2017 | Reig |
| 2004/0104420 A1 | 6/2004 | Coolbaugh |
| 2020/0058582 A1* | 2/2020 | El-Hinnawy ....... H01L 23/5223 |

* cited by examiner

*Primary Examiner* — Matthew E. Gordon
(74) *Attorney, Agent, or Firm* — Jeffrey S LaBaw; L. Jeffrey Kelly; Alum Burromes

(57) ABSTRACT

A switchable metal insulator metal capacitor (MIMcap) and a method for fabricating the MIMcap. In another aspect of the invention operating the MIMcap is also described. A first capacitor plate and a second capacitor plate are separated by a capacitor dielectric and disposed over a substrate. A first via is electrically connected to the first capacitor plate and comprised of phase change material (PCM). The PCM is deposited in an electrically conductive state and convertible by application of heat to an insulating state. A first heater is proximate to and electrically isolated from the PCM in the first via. When the first heater is activated it converts the PCM in the first via to the insulating state. This isolates the first capacitor plate from an integrated circuit.

21 Claims, 12 Drawing Sheets

PRIOR ART

SWITCHABLE METAL INSULATOR METAL CAPACITOR

BACKGROUND OF THE INVENTION

This disclosure relates to integrated circuit devices. More specifically, it relates to a method and structure to create switchable metal insulator metal capacitors (MIMcaps) in semiconductor devices with controllable, i.e. switchable via resistances.

As the dimensions of modern integrated circuitry in semiconductor chips continue to shrink, conventional semiconductor manufacturing technologies are increasingly challenged to make smaller and smaller structures. The high frequency and low power of semiconductor chips requires the use of decoupling capacitors for mitigating power supply or switching noise caused by changes in current flowing in an integrated chip. One popular choice at upper metal levels for decoupling capacitors are MIMcaps for high capacitor density. When used for high performance chips, most of the chip area can be covered by the MIMcaps at these levels. Consequently, the defect density for the MIMcap needs to be very low due to large total area. The MIMcap is a relatively inexpensive element to fabricate as compared to other semiconductor chip elements, but if it causes chip yield loss or early fails due to defects, it becomes an expensive problem.

Thus, it is desirable to provide processes which can be used to make improved switchable metal insulator metal capacitors (MIMcaps).

BRIEF SUMMARY

According to this disclosure, a switchable metal insulator metal capacitor (MIMcap) and a method for fabricating the MIMcap. In another aspect of the invention operating the MIMcap is also described. A first capacitor plate and a second capacitor plate are separated by a capacitor dielectric and disposed over a substrate. A first via is electrically connected to the first capacitor plate and comprised of phase change material (PCM). The PCM is deposited in an electrically conductive state and convertible by application of heat to an insulating state. A first heater is proximate to and electrically isolated from the PCM in the first via. When the first heater is activated it converts the PCM in the first via to the insulating state. This isolates the first capacitor plate from an integrated circuit.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
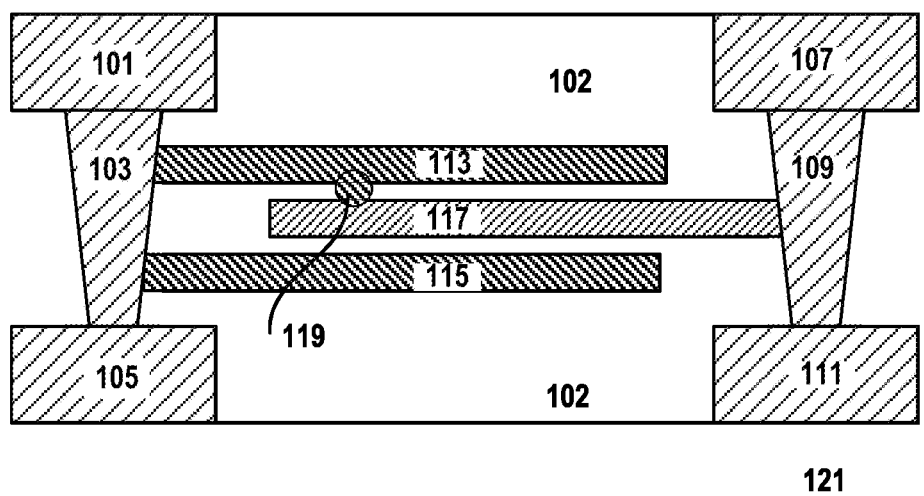
FIG. 1 is a cross-sectional diagram of a prior art structure of an MIMcap illustrating the problems solved by the invention.
Figure 1A:
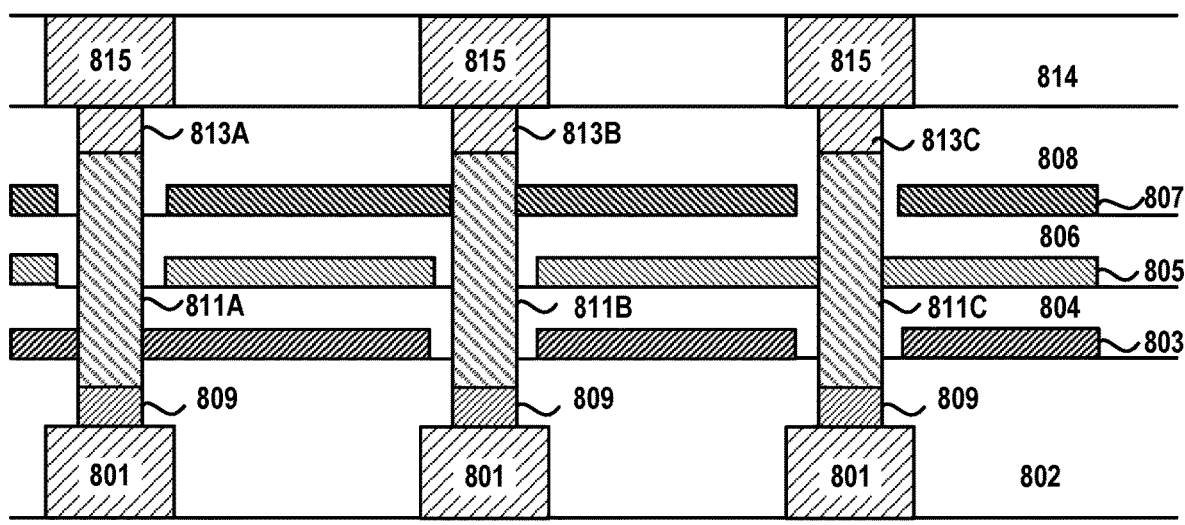

At a high level, the invention includes processes which fill the vias connected to respective metal insulator metal (MIM) capacitor plates with phase change material (PCM) material, which can be changed from a conducting state to a nonconducting state. This will make the via resistance switchable and controllable so that a defective capacitor can be isolated from the rest of the integrated circuit. In the prior art, the vias used to connect MIM plates are filled with a metal such as copper (Cu), so that the via structure cannot be used to manipulate the metal insulator metal capacitors (MIMcaps) and/or to isolate defective MIMcaps.

In embodiments of the invention, when a defective MIMcap is detected, e.g., when a MIMcap starts showing leakage higher than the preset limit during its lifetime, the detected leakage can trigger a metal heater located underneath the via to increase the via temperature. As a result, the PCM in the via will switch the via from a conducting state to an insulating state. With this change, the leaky MIMcap will be isolated to prevent it from causing chip yield loss or early chip failure.

Using embodiments of the invention, an unplanned system failure can be changed to a planned system repair. By isolating the defective MIMcap, a "short" defect which is causing a system failure can be fixed. Though isolating the defective MIMcap can result in some performance degradation in a given core or module, the system management can replace the degraded core with spare cores to save the chip (an electric short will kill a chip). Alternatively, the chip or module can be replaced during a planned system repair.

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures, etc. The substrate can also comprise dielectric materials as described below. Further, active devices may be embedded in the substrate.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein, unless specified, can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of $SiO_2$ and $Si_3N_4$, and metal oxides like tantalum oxide that have relative dielectric constants above that of $SiO_2$ (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

Embodiments will be explained below with reference to the accompanying drawings.

The invention is directed to the problem of how to minimize the impact of defective MIMcaps on chip yield and lifetime. By way of background, there are two types defects which cause defective MIMcaps. A first type of defect is an "open" where conductive material is missing. If this occurs in a capacitive plate, it may impact the chip performance, but this type of defect will not "kill" a chip or portion of a chip. A second type of defect is a "short" where extra conductive material is present (or a portion of insulating dielectric is missing) and makes contact between two conductive structures where they should be insulated from one another. Particularly where a short occurs between capacitive plates, it will kill a chip or portion of a chip. Defects such as opens and shorts can be a process/manufacturing defect, or a defect partially generated by processing and which grows during product operation. One group of these types of defects are called Time Dependent Dielectric Breakdown (TDDB) induced defects.

FIG. 1 depicts a cross-sectional view of a prior art MIMcap. First contact structure 101, 103 and 105 and second contact structure 107, 109 and 111 are disposed in dielectric 102. For ease of illustration, the dielectric 102 is depicted as a single layer, though one skilled in the art would understand that in many embodiments of the invention, several layers of dielectric would be used, possibly of different dielectrics. Typically, the contact structures are comprised of conductive materials e.g., metals such as Cu or Al, although other conductive materials such as other metals and metal alloys can be used. For the dielectric 102, a high-K dielectric such as $HfO_2$, $Al_2O_3$, $Ta_2O_5$, or combination of high-K dielectrics are used although other dielectrics are known to the art and are used in other embodiments of the invention. In preferred embodiments, a high-K dielectric is used between the MIMcap plates and A SiO2 based dielectric or a low K dielectric fills in the rest of the areas designated as dielectric material.

First contact structure 101, 103 and 105 is electrically in contact with upper capacitive plate 113 and lower plate 115 and second contact structure 107, 109 and 111 is in electrical contact with middle capacitive plate 117. The upper, middle and lower capacitive plates 113, 115 and 117 are made of a conductive material. One typical plate material is titanium nitride (TiN). Extra conductive material 119 is shown disposed between upper capacitive plate 113 and middle capacitive plate 117. This causes a short defect between the plates and "kills" the MIMcap and probably the core within the integrated circuit. The entire MIMcap is disposed on a substrate 121. As the usual use for an MIMcap is in the upper metal layers, in the usual case, the substrate 121 is an interlayer dielectric (ILD) such as silicon dioxide disposed over a semiconductor structure with embedded devices, for example, transistors, capacitors and/or diodes as well as other interconnecting metallurgy.

Figure 2:
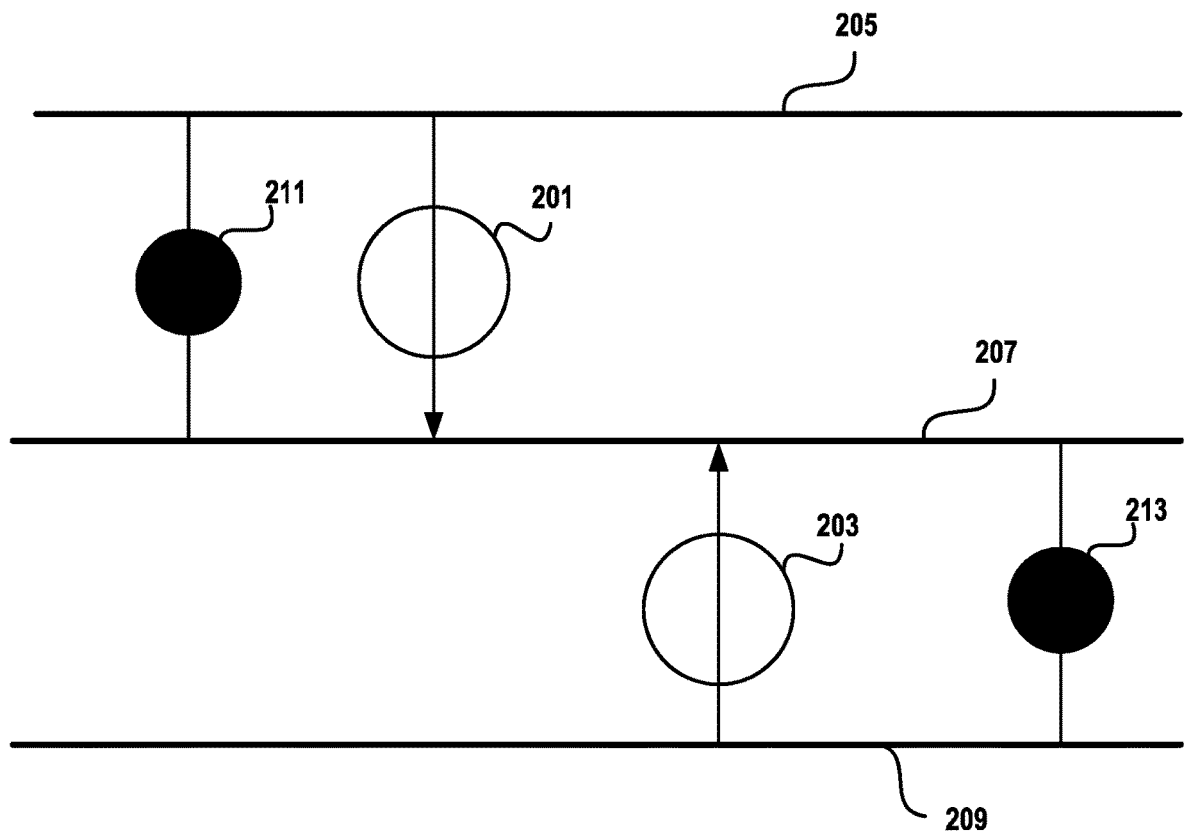
FIG. 2 shows a circuit diagram of a sensing circuit used to determine whether a fault exists or is expected to exist within an MIMcap.

FIG. 2 shows a circuit diagram of a sensing circuit used to determine whether a fault exists or is expected to exist within an MIMcap. A sensing devices 201, 203 are situated between two MIMcap plates to measure leakage current between the two plates. For example, sensing device 201 is situated (electrically) between upper plate 205 and middle plate 207. Another sensing device 203 is situated between middle plate 207 and lower plate 209. Based on the leakage current ($I_{leak}$) detected by the sensing circuits 201, 203, the device decides if any capacitor plate needs to be isolated to prevent high leakage or shorting by respectively closing PCM switch 211 or PCM switch 213 by converting the PCM from the conducting state into the nonconducting/insulating state. Many circuits which measure leakage current are known to the art which can be used to measure the current leakage between the plates for the sensing devices 201, 203. Alternatively, the sensing devices 201, 203 can be other known circuits which apply a small current to the plates to measure voltage to derive a current.

For example, if high leakage or a short between the bottom and middle plates is detected, the system can turn on a metal heater below (or otherwise proximate to) the via connected to the bottom plate to cause the PCM material to change from a highly conductive state to an insulating state. Once the via is an insulator, the bottom plate is isolated from the rest of the device.

Figure 3:
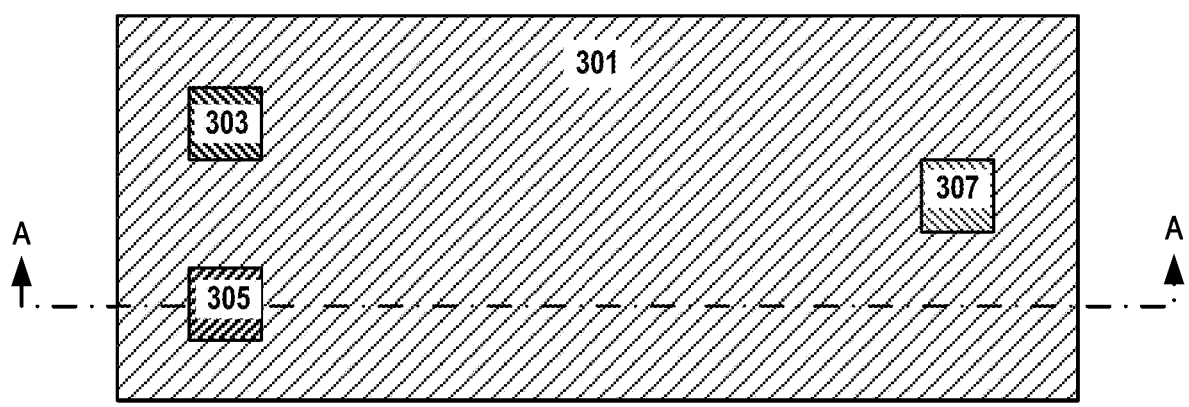
FIG. 3 is a top view of an MIMcap in an embodiment of the invention.

FIG. 3 shows a top view of an embodiment of an MIMcap. The top plate 301 is shown with the locations of three contacts 303, 305 and 307. For clarity, the insulator on which the contacts lie is not shown. Also, the three plates of the MIMcap are of equal area, shape and orientation, so the middle and bottom plates are blocked from view by the top plate. In other embodiments of the invention, the capacitor plates have different shapes, areas and/or alignments. Contact 303 is in electrical contact with a via (not shown as it is blocked from view by the contact) which is in electrical contact with the top plate 301. Contact 305 is in electrical contact with a via in contact with the bottom capacitor plate and contact 307 is in electrical contact with a via in contact with the middle plate. The cross-sectional view AA is shown in FIGS. 4 and 5.

Figure 4:
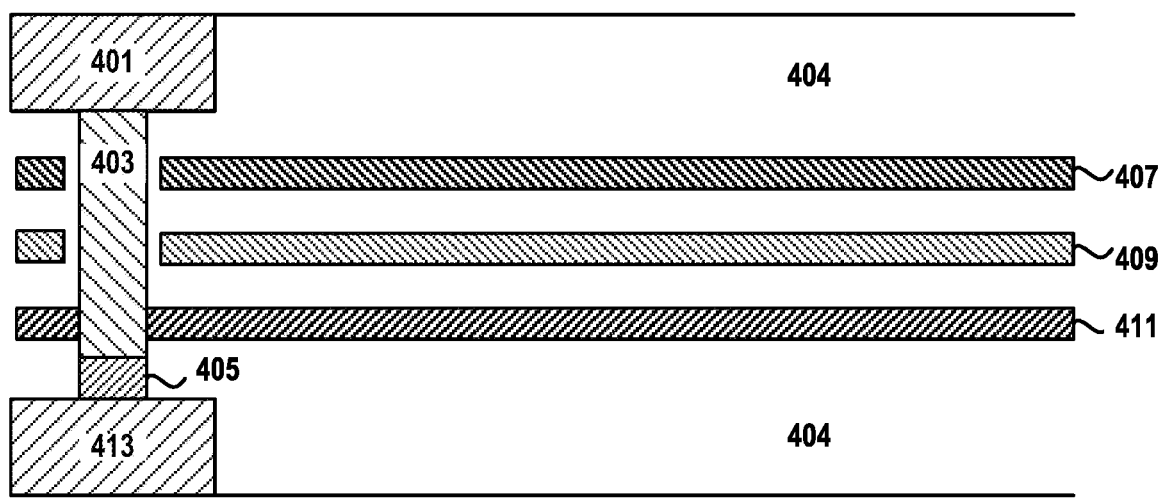
FIG. 4 is a cross-sectional view of a first embodiment of the invention.
Figure 5:
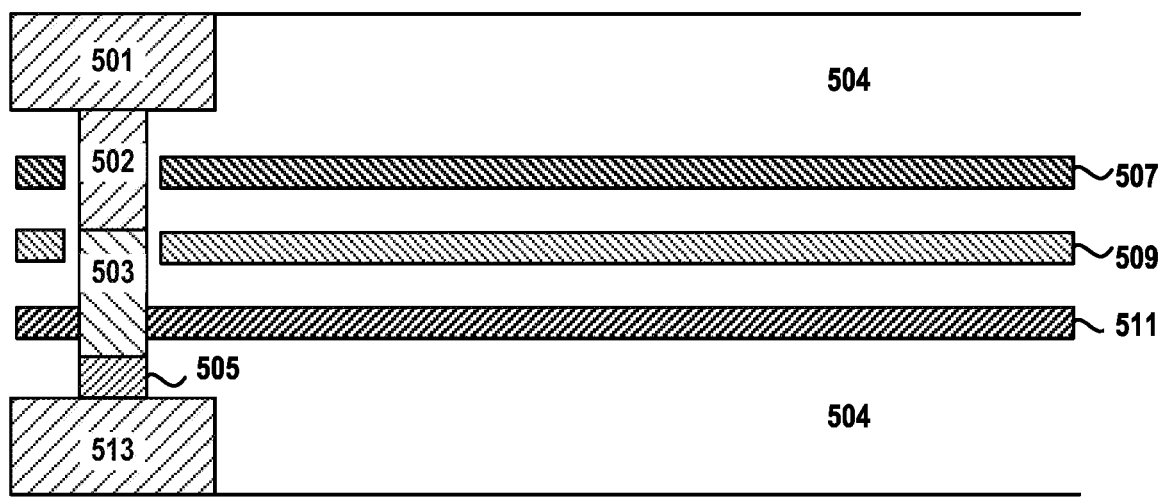
FIG. 5 is a cross-sectional view of a second embodiment of the invention.

FIG. 4 is a cross-sectional view of a first embodiment of the invention. For ease of illustration, a simplified version of the MIMcap is depicted. The top contact 401 is electrically connected to the via which is comprised of via top section 403 and via bottom section 405. Via top section 403 is composed of phase change material (PCM) which is initially in a conductive state and is shown passing through insulator 404, through a hole in the top plate 407, through a hole in the middle plate 409 and electrically in contact with the bottom plate 411. Via bottom section 405 is a highly thermally conductive, electrically insulating material e.g., MN or SiC. The via bottom section 405 is in contact with heater element 413 which is comprised of a metal or a metal containing material such as TaN. The metallurgy which supplies current to the heater 413 is not shown for ease in illustration. In embodiments of the invention, a heating element is a sheet of conductor with fairly high resistivity, such as TaN, TiN or W. When an electric current is forced though the heating element, due to joule heating, its temperature will increase to heat up its surroundings. Depending on the PCM transition temperature, the current can be defined to ensure the phase change of PCM). Other heater elements are known to the art and can be used in alternative embodiments of the invention.

As is mentioned above, if high leakage or a short between the bottom and middle plates is detected, the system turns on the metal heater 413 below the via 405 causing the PCM material 403 to change from a highly conductive state to an insulating state. Once the PCM 403 is an insulator, the bottom plate 411 is isolated from the rest of the device. The capacitor still functions albeit only with the top and middle plates, that is, with lower capacitance. The heater 413 is constructed directly below the via in preferred embodiments, however, other arrangements are possible so long as the heater is proximate to the PCM material and electrically isolated from the MIMcap by the highly thermally conductive, but electrically insulating material.

In this embodiment, the via top section 403 is entirely composed of PCM, however, in other embodiments, as is described below, the via top section 403 is partially comprised of a metal or metal alloy, preferably of a type that is commonly used in conventional MIMcap via structures.

The via top section 403 is composed of a phase change material that is conducting at a first temperature (i.e., low resistance), and becomes insulating at a second temperature that is higher than the first temperature (i.e., high resistance). Such a phase change material is referred to as a "metal-to-insulator" phase change material. In one example, the phase change material may be conducting up to a temperature of 150° C. (i.e., first temperature and then it can be converted into an insulating material above 200° C. (i.e., second temperature). The PCM may be composed of a transition metal oxide such as, for example, Ti2-xVxO3 wherein x is from 0.01 to 0.05. Other transition metal oxides and other phase change materials which exhibit a "metal-to-insulator" phase change are used in other embodiments of the invention.

The contact 401 is comprised of conductive materials e.g., metals such as Cu or Al, although other conductive materials such as other metals and metal alloys are used in other embodiments. In preferred embodiments, the thickness range is between 0.04 um to 3 um. The dielectric 404 between plates 407 & 409, and between plates 409 and 411 is composed of several layers of one or more high-K dielectrics such as HfO$_2$, Al$_2$O$_3$ and Ta$_2$O$_5$. Other high-k dielectrics include ZrO$_2$, La$_2$O$_3$, TiO$_2$, SrTiO$_3$, LaAlO$_3$, Y$_2$O$_3$, HfO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiON, SiN$_x$. Other dielectrics are known to the art and are used in other embodiments of the invention. The dielectric layers between the plates may have a thickness from 1 nm to 10 nm, although other thicknesses are contemplated and can be used in embodiments of the invention. The dielectric in the rest of the dielectric area can be SiO2 or other low K dielectrics. The upper, middle and lower capacitive plates 407, 409, 411 are made of a conductive material such as titanium nitride (TiN). Alternatively, the plate material layer may be titanium (Ti), tantalum (Ta), tantalum nitride (TaN), or copper (Cu). The plate material layers may have a thickness from 10 nm to 200 nm, although other thicknesses are contemplated and are used in embodiments of the invention. Thus, the drawing is out of scale for most embodiments of the invention; the insulator layers being thinner than the capacitive plates.

The dielectric and capacitive plate layers can be formed utilizing a deposition process including, for example, CVD, PECVD, physical vapor deposition (PVD), ALD, sputtering, or other like deposition processes.

Though the drawing only depicts an example for the via 403, 405 connecting to the bottom plate 411, as will be discussed below, similar arrangements can be applied to vias respectively connected to the top capacitor plate 407 and middle capacitor plate 409. Although the embodiments show a preferred three plate MIMcap arrangement, other embodiments of the invention have different numbers of capacitor plates. For example, there are two or four plate embodiments with a corresponding number or a smaller number of vias. When the invention is applied to a two plate MIMcap if a PCM via is converted, the entire device is disabled so only a single PCM via is needed. Another embodiment of the invention uses at least one via which contacts more than one plate. However, in that embodiment, if one plate is defective, more than one plate is isolated; all plates connecting to the same via are isolated by the conversion of the PCM.

FIG. 5 is a cross-sectional view of a second embodiment of the invention. This embodiment is like that described above in connection with FIG. 4, except that a thinner layer of PCM 503 is filled in the via recess and the remainder of the via recess is filled by a metal or metal alloy.

The top contact 501 is electrically connected to the via which is comprised of via top section 502, 503 and via bottom section 505. In this embodiment the via top section is composed of a thinner PCM layer 503 (as compared to the prior embodiment) and the remainder of the via is filled with a conductive material such as copper (Cu) or aluminum (Al) as they are regular via material with higher conductivity. Other metals and metal alloys commonly used for vias such as tungsten (W) are used in other embodiments. The via passes through the dielectric 504 and through a hole in the top plate 507, a hole in the middle plate 509 and a hole in and is electrically in contact with the bottom plate 511. The via bottom section 505 is a highly thermally conductive, electrically insulating material. The heater element 513 is used to convert the PCM from a conducting state to an insulating state.

Figure 6:
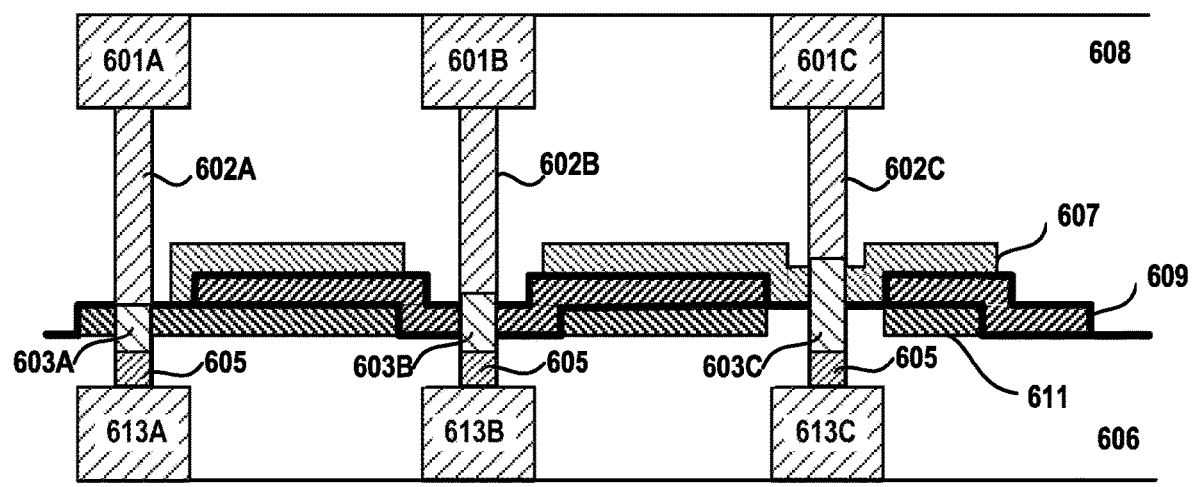
FIG. 6 is a cross-sectional diagram of an embodiment of the invention which shows that the plates are conformal to the topography of the prior layers.

FIG. 6 shows a cross-sectional diagram of an embodiment of the invention which shows that the plates are conformal to the topography of prior layers. That is, the plates are not completely parallel over their full extent as depicted in the simplified drawings. However, large portions of the plate area are parallel and this depiction of an MIMcap is exaggerated with respect to the amount of topography over the extent of the capacitor plate areas.

In the drawing, upper plate 607, middle plate 609 and bottom plate 611 are shown separated by black lines which represent the high-K dielectric. Inter-layer dielectric (ILD) layers 606 and 608 are shown as a thicker layers and may be composed of a different dielectric such as silicon dioxide. The lower plate via is comprised of upper metal layer 602A, PCM layer 603A and thermally conductive layer 605. The via is in electrical contact with bottom plate 611 and contact 601A which leads to Vdd or ground. Heater 613A will heat the PCM layer 603A if a failure is detected between the bottom plate 611 and middle plates.

Similarly, the middle plate via is comprised of upper metal layer 602B, PCM layer 603B and thermally conductive layer 605. The via is in electrical contact with the middle plate 609 and contact 601B. Heater 613B will heat the PCM layer 603B if a short is detected involving the middle plate 609. While the capacitor will still function without a middle plate, if the upper and bottom plates are not both connected to either Vdd or GND, which is rare in integrated circuit design. Therefore, in some embodiments, only the bottom and top plates have PCM material in the vias and the via to the middle plate is entirely comprised of the conductive metal 602B. The upper plate via is comprised of upper metal layer 602C, PCM layer 603C and thermally conductive layer 605. The via is in electrical contact with the upper plate 607 and with contact 601C. Heater 613C will convert the PCM layer 603C to an insulator if a failure is detected in the upper plate 607.

As shown in the drawing, the heights of the PCM layers can vary in the vias for the different plates. If the vias are the same heights, then the upper metal layer will vary in height as well since it fills a remainder portion of the via. The PCM layers need to cover the thickness of the respective plate to which it electrically connects. The interface between the PCM and the upper metal needs to be higher than the top of plate. That way, if the PCM is converted to an insulator, the plate can be isolated. Alternatively, PCM can have the same height (e.g., raising 603A top surface to the same level as 603C) to simplify the process.

The materials used in this embodiment are similar to those described above

Figure 7:
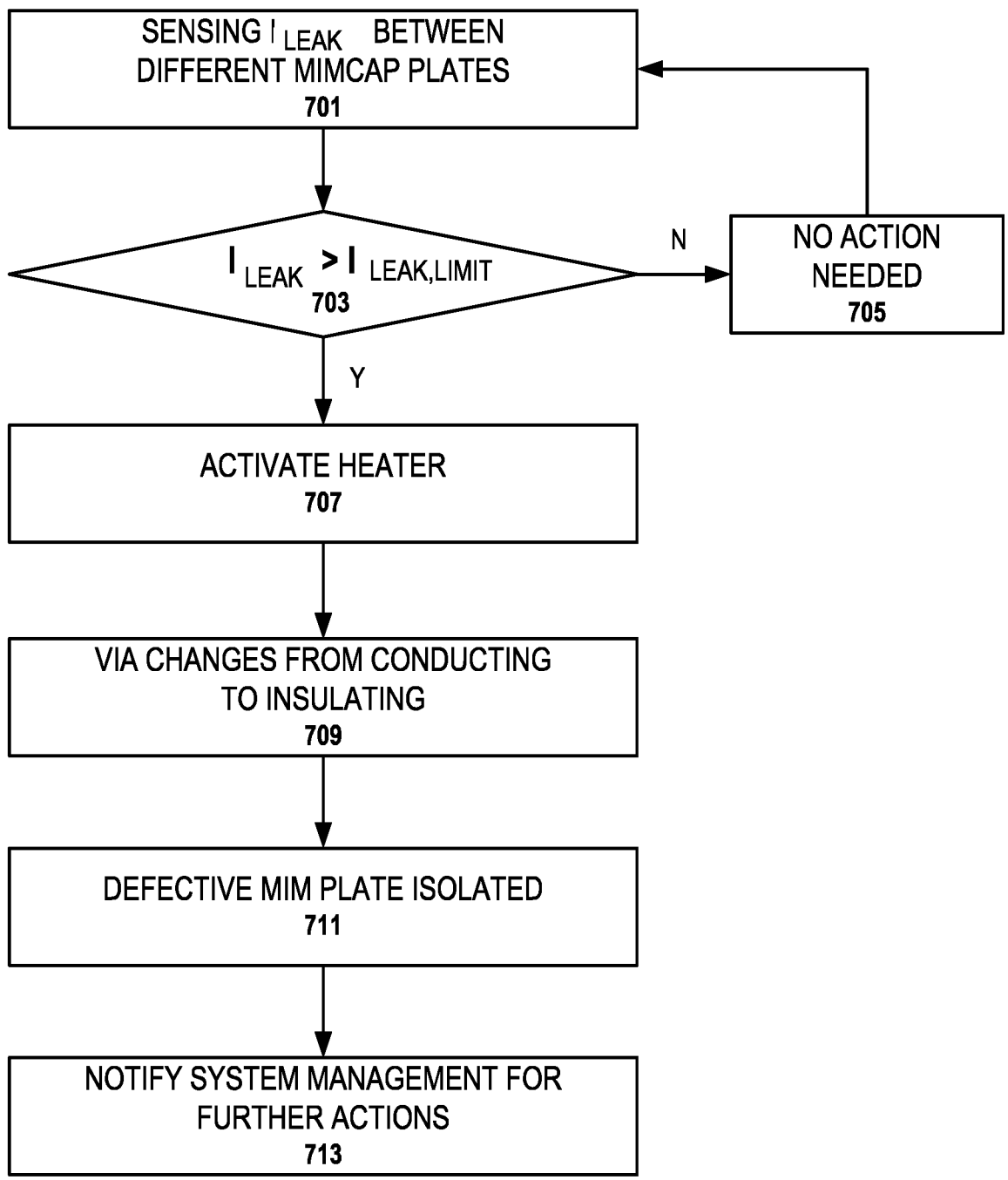
FIG. 7 is a flow chart of one embodiment of the invention for sensing when a plate in the MIMcap needs to be electrically isolated.

FIG. 7 is a flow chart of one embodiment of the invention for sensing when a plate in the MIMcap needs to be electrically isolated. In step 701, the sensing circuit continuously senses the current leak (Leak) between different MIMcap plates. In step 703, it determines whether the current leak exceeds a threshold, i.e. $I_{leak} > I_{leak,limit}$. If not, step 705, no action is needed and the sensing circuit resumes monitoring the current leak.

If the current leak exceeds the threshold, in step 707, the appropriate heater is activated. Because of the heat conducted to the PCM layer in the via, step 709, that portion of the via changes from a conducting state to an insulating state. Thus, step 711, the defective MIM plate is isolated from the rest of the device. In step 713, the system management is notified for further actions such as replacing the degraded core with spare cores to save the chip or adding the chip or module to a list to be replaced during a planned system repair.

Figure 8:
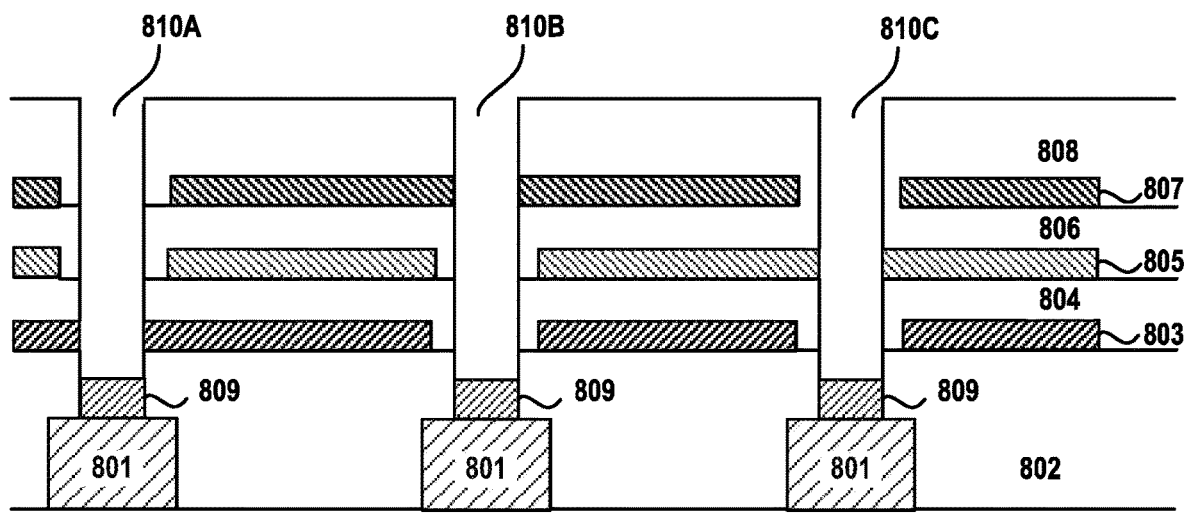
FIG. 8 is a cross-sectional diagram of an embodiment of the invention which shows an intermediate process step as the vias are being fabricated.

FIG. 8 is a cross-sectional diagram of an embodiment of the invention which shows an intermediate process step as the vias are being fabricated.

To fabricate the structure, first the ILD dielectric 802 and the heaters 801 are deposited over a substrate. Conventional deposition processes such as atomic layer deposition (ALD), chemical vapor deposition (CVD), plasma enhanced chemical vapor deposition (PECVD), electroless plating are used to deposit the dielectrics and heaters in respective embodiments. As is mentioned above, the interlayer dielectric (ILD) 802 may be silicon dioxide and the heater 801s are comprised of a metal or a metal containing material such as TaN. The metallurgy which supplies current to the heaters 802 is not shown for ease in illustration nor are the details of the substrate which comprises, for example, a semiconductor structure with embedded devices, for example, transistors, capacitors and/or diodes as well as other interconnecting metallurgy.

Next, in one embodiment, a series of metal deposition, patterning and dielectric deposition steps take place to define the capacitor plates 803, 805 and 807 and the dielectric layers 804, 806 and 808. That is, first a metal layer is formed for bottom capacitor plate 803 using a deposition process, e.g., ALD, CVD, PECVD, PVD or sputtering. Then, the bottom capacitor plate 803 is patterned by lithography and etching to define its boundaries and to provide openings for the via recesses 810A, 810B and 810C in between patterned portions (shown as segments in cross-section) of the bottom capacitor plate 803. Then, a conventional deposition step is used to deposit high-K dielectric layer 804. The metal deposition, patterning and dielectric deposition steps are repeated for middle capacitor plate 805, high-K dielectric layer 806, top capacitor plate 807 and dielectric layer 808. In embodiments of the invention, dielectric layer 808 may be a thicker layer than high-K dielectric layers 804, 806 disposed between capacitor plates. High-K dielectric layers 804, 806 function as capacitor dielectrics in the MIMcap. Alternative embodiments use lift-off or Damascene processes to pattern the capacitor plates.

Next, the via recesses 810A, 810B and 810C are formed using lithography and etching. In alternative embodiments, the top dielectric layer 808 is planarized using a planarization process, for example, a chemical mechanical polishing (CMP) step is performed in embodiments of the invention. A sacrificial capping layer (not shown) can be used in these steps to help the etch step define the via recesses 810A, 810B and 810C.

Finally, the thermally conductive material 809 deposited in the via recesses 810A, 810B and 810C.

Figure 9:
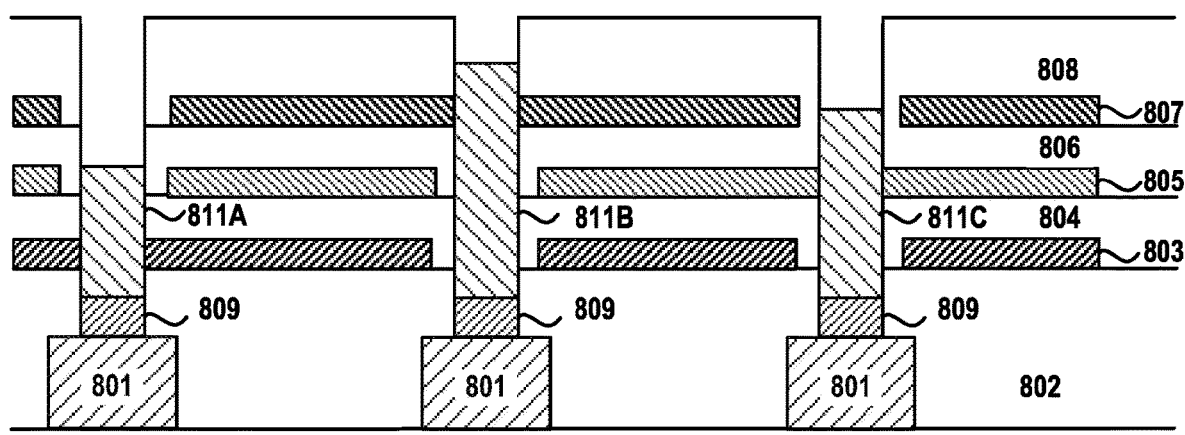
FIG. 9 is a cross-sectional diagram of an embodiment of the invention after several PCM deposition steps.

FIG. 9 is a cross-sectional diagram of an embodiment of the invention after several PCM deposition steps. In this embodiment, the three PCM layers 811A, 811B and 811C are deposited in separate depositions as they have different heights. In other embodiments, to simplify the process, it is preferable to have all the PCM layers with the same height and deposited simultaneously. Each PCM layer is at least as high as the top surface of the capacitor plate to which it is electrically connected and disposed on the thermally conductive layer 809. For example, PCM layer 811A is higher than bottom plate 803. Blockout masks are used to cover the other via recesses during a PCM deposition. For example, during the deposition of PCM layer 811A for the bottom plate 803, the via recesses for the middle plates are covered. Other processes using subtractive etches and blockout masks could be used as an alternative processes for defining the PCM layers. Further, as mentioned above, in other embodiments, the entire via recess is filled with the PCM layer. Yet further, a uniform height of the PCM layer can be used and a remainder filled with a conductive metal as the via recesses are protected by dielectric from the plates to which they are not to be connected. For example, the uniform PCM height could be above the top surface of the top plate.

Figure 10:
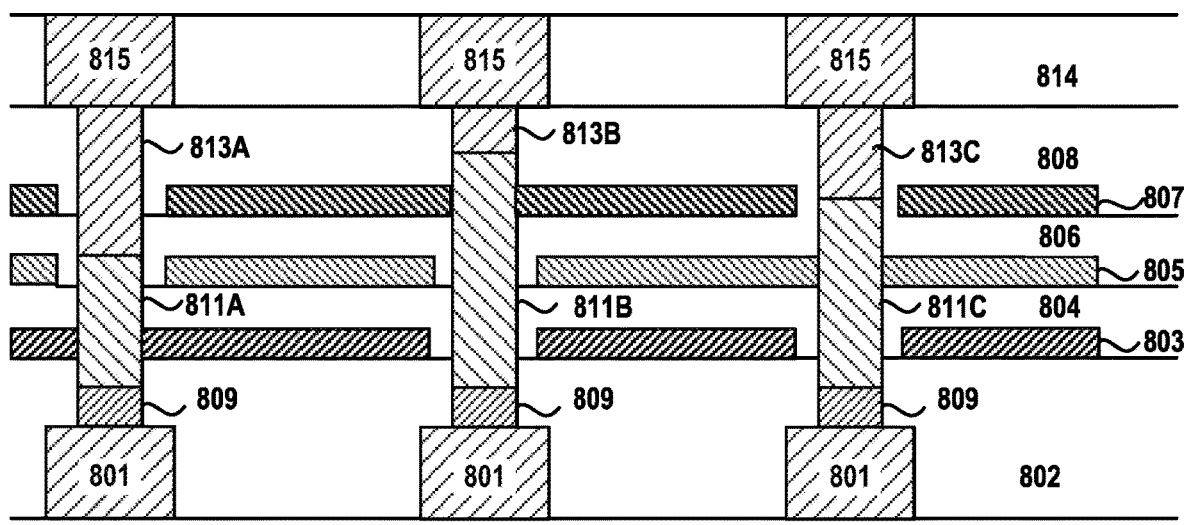
FIG. 10 is a cross-sectional diagram of an embodiment of the invention after the contacts are fabricated.

FIG. 10 is a cross-sectional diagram of an embodiment of the invention after the contacts are fabricated. Next, the conductive metal layers 813A, 813B and 813C are deposited in the remainder of the via recesses. Because the heights of the PCM layers 811A, 811B and 811C are different in each of the recesses, the remainders and the metal layers will be different (presuming the total via recess lengths are equal). A planarization step is performed in some embodiments so that the top surfaces of the conductive metal layers 813A, 813B and 813C are coplanar with the top surface of the dielectric layer 808.

Next, a dielectric layer 814 is deposited, patterned and etched to produce contact recesses in which the contacts 815 are formed. The contacts each make electrical contact a respective one of the vias.

Figure 10A:
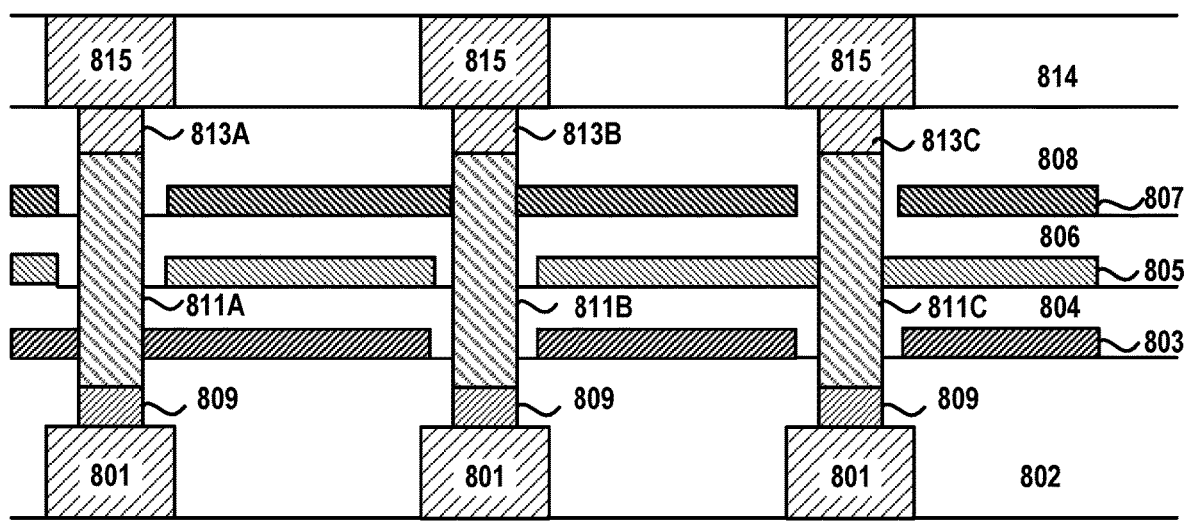
FIG. 10A is a cross-sectional diagram of an embodiment of the invention after the contacts are fabricated.

FIG. 10A is a cross-sectional diagram of an embodiment of the invention after the contacts are fabricated where the thicknesses of the PCM layers are the same.

The resulting structures can be included within integrated circuit chips, which can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A switchable metal insulator metal capacitor (MIMcap) comprising:
    a first capacitor plate;
    a second capacitor plate;
    a first capacitor dielectric separating the first and second capacitor plates;
    a first via electrically connected to and contacting the first capacitor plate comprised of phase change material (PCM) layer in an electrically conductive state, the PCM layer in the first via having a top surface coplanar or higher than a top surface of the first capacitor plate and convertible by application of heat to an insulating state; and
    a first heater proximate to and electrically isolated from the PCM layer in the first via;
    wherein the first heater is capable of converting the PCM layer to the insulating state, thereby isolating the first capacitor plate.

2. The MIMcap as recited in claim 1 further comprising;
    a second via electrically connected to and contacting the second capacitor plate comprised of phase change material (PCM) layer in an electrically conductive state, the PCM layer in the second via having a top surface coplanar or higher than a top surface of the second capacitor plate and convertible by application of heat to an insulating state; and
    a second heater proximate to and electrically isolated from the PCM layer in the second via;
    wherein the second heater is capable of converting the PCM layer to the insulating state, thereby isolating the second capacitor plate.

3. The MIMcap as recited in claim 2, further comprising:
    a third capacitor plate disposed between the first capacitor plate and the second capacitor plate;

a second capacitor dielectric layer separating the first capacitor plate and the third capacitor plate and the third capacitor plate and the second capacitor plate.

4. The MIMcap as recited in claim 3, further comprising:
a third via electrically connected to and contacting the third capacitor plate comprised of phase change material (PCM) layer in an electrically conductive state, the PCM layer in the third via having a top surface coplanar or higher than a top surface of the third capacitor plate and convertible by application of heat to an insulating state; and
a third heater proximate to and electrically isolated from the PCM layer in the third via;
wherein the third heater is capable of converting the PCM layer in the third via to the insulating state, thereby isolating the third capacitor plate.

5. The MIMcap as recited in claim 1, wherein the first heater is disposed beneath the first via and a thermally conductive, electrically non-conductive layer is disposed on top of the first heater and the PCM layer is disposed on the thermally conductive, electrically non-conductive layer in the first via.

6. The MIMcap as recited in claim 1, further comprising:
a conductive layer on the PCM layer in the first via, the conductive layer comprised of a material selected from the group of a metal and a metal alloy; and
a contact on the conductive layer.

7. The MIMcap as recited in claim 1, further comprising:
a sensing circuit for detecting a short or current leakage between the first capacitor plate and the second capacitor plate;
wherein the sensing circuit is used to activate the first heater.

8. The MIMcap as recited in claim 3, wherein a thickness of the PCM layer in the first via is different than a thickness of the PCM layer in the second via.

9. The MIMcap as recited in claim 3, wherein a thickness of the PCM layer in the first via is the same as a thickness of the PCM layer in the second via.

10. A switchable metal insulator metal capacitor (MIMcap) comprising:
a first capacitor plate;
a second capacitor plate;
a first capacitor dielectric separating the first and second capacitor plates;
a first via electrically connected to the first capacitor plate comprised of phase change material (PCM) layer in an electrically conductive state, the PCM convertible by application of heat to an insulating state;
a first heater proximate to and electrically isolated from the PCM layer in the first via, wherein the first heater is capable of converting the PCM layer in the first to the insulating state, thereby isolating the first capacitor plate;
second via electrically connected to the second capacitor plate comprised of phase change material (PCM) layer in an electrically conductive state, the PCM layer convertible by application of heat to an insulating state; and
a second heater proximate to and electrically isolated from the PCM layer in the second via, wherein the second heater is capable of converting the PCM layer in the second via to the insulating state, thereby isolating the second capacitor plate.

11. The MIMcap as recited in claim 10, further comprising:
a third capacitor plate disposed between the first capacitor plate and the second capacitor plate;
a third via electrically connected to the third capacitor plate comprised of phase change material (PCM) layer in an electrically conductive state, the PCM layer convertible by application of heat to an insulating state; and
a third heater proximate to and electrically isolated from the PCM layer in the third via, wherein the third heater is capable of converting the PCM layer in the third via to the insulating state, thereby isolating the third capacitor plate.

12. The MIMcap as recited in claim 10, wherein the first heater is disposed beneath the first via and a thermally conductive, electrically non-conductive layer is disposed on top of the first heater and the PCM layer is disposed on the thermally conductive, electrically non-conductive layer in the first via.

13. The MIMcap as recited in claim 10, further comprising:
a sensing circuit for detecting a short or current leakage between the first capacitor plate and the second capacitor plate;
wherein the sensing circuit is used to activate the first heater.

14. The MIMcap as recited in claim 10, wherein a top surface of the PCM layer in the first via is coplanar or higher than a top surface of the first capacitor plate and a top surface of the PCM layer in the second via is coplanar or higher than a top surface of the second capacitor plate.

15. The MIMcap as recited in claim 10, wherein a thickness of the PCM layer in the first via is different than a thickness of the PCM layer in the second via.

16. A switchable metal insulator metal capacitor (MIMcap) comprising:
a first capacitor plate;
a second capacitor plate;
a first capacitor dielectric separating the first and second capacitor plates;
a first via electrically connected to the first capacitor plate comprised of phase change material (PCM) layer in an electrically conductive state, the PCM layer convertible by application of heat to an insulating state; and
a first heater proximate to and electrically isolated from the PCM layer in the first via;
a sensing circuit for detecting a short or current leakage between the first capacitor plate and the second capacitor plate;
wherein the sensing circuit is used to activate the first heater and the first heater is capable of converting the PCM layer to the insulating state, thereby isolating the first capacitor plate.

17. The MIMcap as recited in claim 16 further comprising;
a second via electrically connected to the second capacitor plate comprised of phase change material (PCM) layer in an electrically conductive state, the PCM layer convertible by application of heat to an insulating state; and
a second heater proximate to and electrically isolated from the PCM layer in the second via;
wherein the second heater is capable of converting the PCM layer to the insulating state, thereby isolating the second capacitor plate.

18. The MIMcap as recited in claim 17, further comprising:

a third capacitor plate disposed between the first capacitor plate and the second capacitor plate; and a second capacitor dielectric layer separating the first capacitor plate and the third capacitor plate and the third capacitor plate and the second capacitor plate.

19. The MIMcap as recited in claim 18, further comprising:
a third via electrically connected to and contacting the third capacitor plate comprised of phase change material (PCM) layer in an electrically conductive state, the PCM layer convertible by application of heat to an insulating state; and a third heater proximate to and electrically isolated from the PCM layer in the third via;

wherein the third heater is capable of converting the PCM layer in the third via to the insulating state, thereby isolating the third capacitor plate.

20. The MIMcap as recited in claim 16, further comprising:
a conductive layer on the PCM layer in the first via, the conductive layer comprised of a material selected from the group of a metal and a metal alloy; and a contact on the conductive layer.

21. The MIMcap as recited in claim 17, wherein a top surface of the PCM layer in the first via is coplanar or higher than a top surface of the first capacitor plate and a top surface of the PCM layer in the second via is coplanar or higher than a top surface of the second capacitor plate.

* * * * *